United States Patent [19]

Peterson

[11] 4,147,943

[45] Apr. 3, 1979

[54] SENSITIVE HIGH SPEED CLOCKED COMPARATOR

[75] Inventor: James G. Peterson, Redondo Beach, Calif.

[73] Assignee: TRW Inc., Los Angeles, Calif.

[21] Appl. No.: 877,698

[22] Filed: Feb. 14, 1978

[51] Int. Cl.$^2$ ............................................... H03K 5/20
[52] U.S. Cl. ............................. 307/355; 307/DIG. 3; 328/146
[58] Field of Search ......... 307/353, 355, 356, DIG. 1, 307/DIG. 3; 328/146, 147

[56] References Cited

U.S. PATENT DOCUMENTS 3,621,301  11/1971  Tomczak ........................ 307/355 X

OTHER PUBLICATIONS

J. E. Gersbach, "Surefire Latch", IBM Technical Disclosure Bulletin, vol. 18, No. 1, Jun. 1975, p. 73.

Primary Examiner—John Zazworsky
Attorney, Agent, or Firm—Spensley, Horn, & Lubitz

[57] ABSTRACT

A sensitive high speed clocked comparator for use with low level differential logic circuits which utilizes an amplifier, a Gilbert Gain Cell, and load devices to amplify the difference between analog voltages being compared, and a high speed latch to increase the output voltage level of the Gain Cell up to the level of logic signals used in low level differential logic circuits. The circuit has two modes, a "follow" mode wherein the amplifier and Gilbert Gain Cell cause an unbalance in the currents through two load devices responsive to any difference in input voltage, and a "latch" mode wherein a latch causes the current unbalance to increase and to latch. The modes are sequentially selected by clocking.

23 Claims, 2 Drawing Figures

SENSITIVE HIGH SPEED CLOCKED COMPARATOR

BACKGROUND OF THE INVENTION

1. Field of the Invention

The present invention relates generally to the field of comparators, and more particularly to the field of high speed comparators for use in low level logic circuits.

2. Prior Art

One important operation which must be performed in many electronic logic circuits is that of comparison of the amplitude of two voltages, with the resulting signal being suitable for use with logic circuitry. This can be done by simply using a differential amplifier and noting whether the output is positive or negative with respect to a predetermined zero level as an indication of which voltage is higher. Since output voltage swings of at least 200 millivolts are needed to operate low level logic circuits, relatively high gain amplifiers are required to compare low voltage differences of the order of 2 millivolts. When the differential voltage to be detected is relatively high and/or the speed with which the detection must be accomplished is slow, this approach may be satisfactory, but if the differential voltage is of the order of a few millivolts or less and detection must be accomplished in a few nanoseconds, it is difficult to provide the circuit bandwidth required for reliable operation. This is particularly true for applications requiring a large number of comparators, such as high speed parallel A/D converters where complexities must be minimized.

In general, techniques to improve switching time response result in reduced sensitivity. For example, it is common to provide positive feedback around an amplifier to cause it to switch rapidly from one state to another, but in so doing, a dead zone is created with respect to the input voltage so that the input voltage resolution is impaired.

One well known way of assessing the relative performance of comparators is by comparison of their effective gain-bandwidth products. The higher the gain-bandwidth product, the better is the performance. Prior art comparators of the types described above have gain-bandwidth products of the order of 300 to 400 megahertz whereas the effective gain-bandwidth product of an exemplary embodiment of the present invention is of the order of 30 gigahertz.

One previously known way of improving the response of a comparator having positive feedback as described above is to apply the positive feedback only after the differential voltage is applied using a strobe or clock pulse, so as to avoid the dead zone problem occasioned by the positive feedback. Such a comparator has a much improved gain-bandwidth product, perhaps of the order of 25 gigahertz, still below that of the present invention. Further, for equivalent complexity, the comparator of the present invention will provide an input impedance substantially higher (of the order of three to five times) than that of strobed feedback comparators known in the prior art.

SUMMARY OF THE INVENTION

The present invention utilizes a relatively low gain, but fast response, Gilbert Gain Cell in conjunction with a clocked latch to provide a very high speed, sensitive comparator. Detection of voltage differences of less than one millivolt in times of the order of 7 nanoseconds to provide low level differential logic signals for systems requiring logic voltage swings of the order of 200 to 400 millivolts can be achieved using the present invention.

The Gilbert Gain Cell operates in the current mode, that is, a constant supply current is divided into two branches in a manner which depends upon the differential input voltage. As the differential input voltage increases, the current in one branch increases while that in the other branch decreases. The currents are conducted through a pair of resistors, and the resulting voltage difference is applied to a latching circuit which responds to the polarity of the differential voltage applied thereto and, in synchronism with a clocking pulse, switches to a corresponding logic state.

As mentioned above, it has been known to use a two step technique with a voltage amplifier and a feedback loop strobed in to latch the output. The use of a Gilbert Gain Cell, however, results in a substantially higher input impedance (three to five times) than the voltage amplifier system referred to, due, in great measure, to the reduction of Miller effect and reduced bias current in the input transistors. The effective gain-bandwidth product of an equivalent comparator using the principles of this invention is also somewhat higher than the prior art comparators.

DETAILED DESCRIPTION OF THE PRESENTLY PREFERRED EMBODIMENTS

Figure 1:
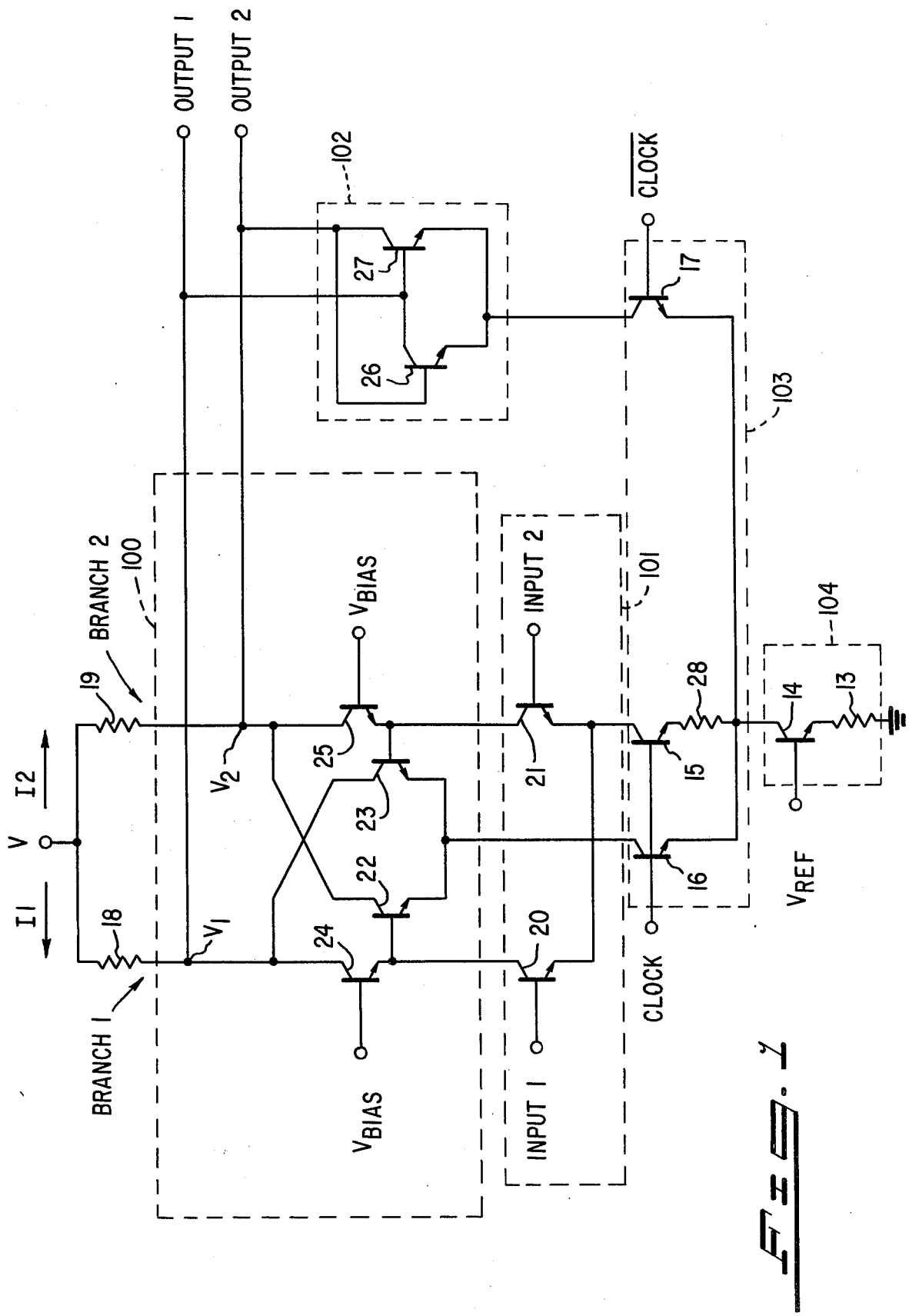
FIG. 1 is a circuit diagram of the invented comparator.

The four basic building blocks of the present invention are: a Gilbert Gain Cell, the components comprising which are shown in the circuit diagram of FIG. 1 within the dashed rectangle 100, an input differential amplifier shown within the dashed rectangle 101, an output latch shown within the dashed rectangle 102, and the means for switching between the two operating modes of the comparator, shown within the dashed rectangle 103. The circuit of FIG. 1 is powered by a constant supply current maintained by regulator 104 which is comprised of transistor 14 and resistor 13.

As will be described in more detail below, this supply current will flow either through transistor 17 and latch 102, or through transistors 15 and 16 and through amplifier 101 and Gilbert Gain Cell 100, depending on the state of a "clock" signal applied to transistors 15, 16 and 17. The condition whereby the supply current passes through transistors 15 and 16 is called the "follow" mode, and the condition whereby it passes through transistor 17 is called the "latch" mode.

In the "follow" mode the input amplifier 101 and Gilbert Gain Cell 100 are operative to amplify a differential analog input voltage at inputs 1 and 2, so as to provide an amplified voltage difference V1-V2 having the same polarity as the input voltage.

In the "latch" mode, latch 102, which has two stable states, assumes the state corresponding to the polarity of V1-V2 in the immediately preceding "follow" mode condition. The latch 102 not only latches the differential voltage V1-V2 produced by the Gilbert Gain Cell, but causes it to increase to a useful level. The amplitude of the output voltage of the comparator, which appears across output terminals 1 and 2, is of the order of 200–400 millivolts in the "latch" mode, sufficient to be used as a logic signal in low level differential logic systems.

The operation of the comparator is controlled by the CLOCK signal applied to the bases of transistors 15, 16 and 17. When CLOCK is true, the comparator is in the "follow" mode, and when CLOCK is false ($\overline{\text{CLOCK}}$ true) the comparator is in the "latch" mode. The binary logic signal appearing at the output terminals of the comparator in the "latch" mode is determined by the polarity of the signal at input terminals 1 and 2 just prior to the moment that CLOCK switches from true to false. Subsequent changes in the polarity of the input signal have no effect on the output of the comparator until the CLOCK signal again goes true. In effect, then, the invented comparator samples the input analog signal at the time of transition of CLOCK from true to false, and provides a stable binary logic signal whose polarity depends upon the polarity of the input analog signal at the moment CLOCK goes false.

The structure and operation of the invented comparator will be described below by first considering the comparator in the "follow" mode wherein the Gilbert Gain Cell 100 and input amplifier 101 are operative, and then in the "latch" mode wherein latch 102 governs.

The Gilbert Gain Cell 100 is an amplifier which operates in the current mode, that is, it provides current amplification rather than voltage amplification. The Cell is characterized by a relatively low gain, but very fast response. The construction is simple and is suitable for large scale integrated systems. The Gain Cell comprises a pair of branch transistors 24 and 25 which are both biased into their linear regions by a voltage V bias. The source of V bias is not shown in the circuit of FIG. 1 as it may be obtained in any conventional manner, many of which are well known in the art. In the preferred embodiment of the Gain Cell herein described transistors 24 and 25 have substantially identical characteristics. The collectors of transistors 24 and 25 are connected to the supply voltage V through substantially equal load devices in the form of resistors 18 and 19, which develop the output voltage of the Cell, V1-V2.

The emitters of transistors 24 and 25, which are the signal input terminals of the Gain Cell, are connected to the output terminals of differential amplifier 101 (the collectors of transistors 20 and 21) and thence to a source of substantially fixed current.

Resistor 13 and the voltage V ref acting through transistor 14 comprise a current regulator which is commonly called a constant current source and serves to provide bias current to the amplifier 101 and the Gain Cell 100. The bias current supplied thereby, in the "follow" mode, is split into two portions, one flowing through transistor 15 and one flowing through transistor 16. (It will be remembered that in the "follow" mode CLOCK is true and $\overline{\text{CLOCK}}$ is false and therefore transistors 15 and 16 will be "on" and transistor 17 will be "off.") The CLOCK voltage used is not so high that these transistors will be saturated and under this condition resistor 28 determines what portion of the total current will flow through transistors 24 and 25 via the signal input terminals of the Gain Cell. As is known by those skilled in the art, the gain of a Gilbert Gain Cell is determined by the ratio of the sum of the currents through the input terminals to the current through the common terminal, i.e., the ratio of the total current through transistors 24 and 25 to the total current through transistors 22 and 23. This ratio may be set as desired by selection of resistor 28. In exemplary embodiments of the invented comparator, three to five times as much current may flow through the common terminal (through transistor 16) as through the input terminals (through transistor 15).

A pair of cross connected transistors 22 and 23 have their collectors connected to the collectors of transistors 25 and 24 respectively and their bases connected to the emitters of transistors 24 and 25 respectively. The emitters of transistors 22 and 23 are tied together and are connected to a substantially constant current through transistor 16. As described above, the current through transistor 16 is a fixed proportion of the current set by regulator 104.

Transistors 20 and 21 comprise an input amplifier which converts a small difference in input voltage to a current difference through the input terminals of the Gilbert Gain Cell. This current is then amplified by the Gain Cell. If the voltage at input 1 equals the voltage at input 2, and the transistors in the circuit are matched, the output of the Gain Cell (V1-V2) will be zero, since the current through transistor 15 will divide equally between transistors 20 and 21.

If the voltage at input 1 is increased relative to input 2, the current through transistor 20 will increase and that of transistor 21 will decrease. The current through transistor 24 will thus increase and the voltage on the base of transistor 22 will drop causing less current to flow through transistor 22. The effect on transistors 23 and 25 is the opposite, so that although the total current through the amplifier and Gain Cell remains about the same, the current through resistor 18 (the sum of the currents through transistors 23 and 24) is increased and the current through resistor 19 (the sum of the currents through transistors 22 and 25) is decreased. The voltage gain between inputs 1 and 2 and outputs 1 and 2 is relatively low, being, in exemplary embodiments of the invention, about 7. An advantage of this connection is, however, that it responds very rapidly to changes in applied differential voltage. Another advantage of using the Gilbert Gain Cell in this configuration is that transistors 24 and 25 present a very low impedance to transistors 20 and 21 so that the Miller effect on the transistors of input amplifier 101 is very low and hence input capacitance is low. Still another advantage is that the bias current in amplifier 101 is reduced leading to an increase in input impedance.

While the circuit in the "follow" mode as described above responds rapidly and has a high input impedance, it is not satisfactory for use as a low level comparator since its differential output voltage, V1-V2, is too low to be used as a logic signal. This disadvantage is obviated in the invented comparator by providing a latching means under control of the clock signal which does not appreciably slow down the initial detection of a voltage difference, or decrease the input impedance, but which does increase and hold the magnitude of the differential output voltage at one of two logic levels. For low level differential logic circuits this corresponds to a differential voltage of 200 to 400 millivolts. The latching circuit 102 is coupled to load devices 18 and 19 at the output of the Gilbert Gain Cell and is clocked "on" only after the amplifier and Gain Cell have amplified the input voltage difference at the inputs 1 and 2 to a voltage V1-V2 having a polarity determined by the polarity of the input differential voltage.

Thus, as described above, the invented comparator is initially operated in its "follow" mode with CLOCK true and input amplifier 101 and Gilbert Gain Cell 100 active in amplifying analog signals at the input terminals 1 and 2. The input signal is amplified and appears as voltage V1-V2 at the output terminals of the Gain Cell, the collectors of transistors 24 and 25. In exemplary embodiments of the invented comparator, for example, a differential voltage of one millivolt at input terminals 1 and 2 results in a Gain Cell output, V1-V2, of seven millivolts. The output voltage V1-V2 will appear a very short period of time after application of the differential input voltage, for example, in about seven nanoseconds in an exemplary embodiment of the invented comparator.

After the initial comparison in the "follow" mode is complete, the comparator is switched to the "latch" mode by switching CLOCK false and $\overline{\text{CLOCK}}$ true. Since $\overline{\text{CLOCK}}$ true turns transistor 17 "on," current starts to flow through transistors 26 and 27 which comprise the latch 102. The total bias current as before is determined by V ref acting through transistor 14, and resistor 13, but it now flows through transistor 17 instead of transistors 15 and 16. The current is not evenly divided between transistors 26 and 27, however, transistor 27 or transistor 26 drawing more current depending on whether V1 is higher than V2 or vice versa.

The transistors 26 and 27 are connected as a two stage common emitter amplifier with 100% positive feedback. Such an amplifier has only two stable states: all of the bias current flowing through one of the transistors or all flowing through the other, and the amplifier will rapidly switch to one of said states as soon as current flow through the transistors 26 and 27 is established by switching transistor 17 "on." If, at the moment transistor 17 is switched "on," V1 is greater than V2, due to the current unbalance in load resistors 18 and 19 produced during the preceding "follow" mode, the latch 102 will quickly assume the state wherein transistor 27 carries all of the current flowing through transistor 17, and transistor 26 will be non conducting. The increase in the current unbalance in resistors 18 and 19 thus created will cause the voltage V1-V2 to increase to the level of a binary logic signal for low level differential logic, i.e. 200 to 400 millivolts. Similarly, if V2 is greater than V1, the current unbalance in resistors 18 and 19 will cause the opposite binary state to appear at outputs 1 and 2. This logic signal will be held at the output terminals irrespective of subsequent changes in the input voltage until CLOCK again becomes true and the comparator once again enters its "follow" mode. CLOCK going false again will then create a new output logic signal corresponding to the polarity of the input voltage at the moment of switching from "follow" to "latch" (CLOCK true to CLOCK false).

Figure 2:
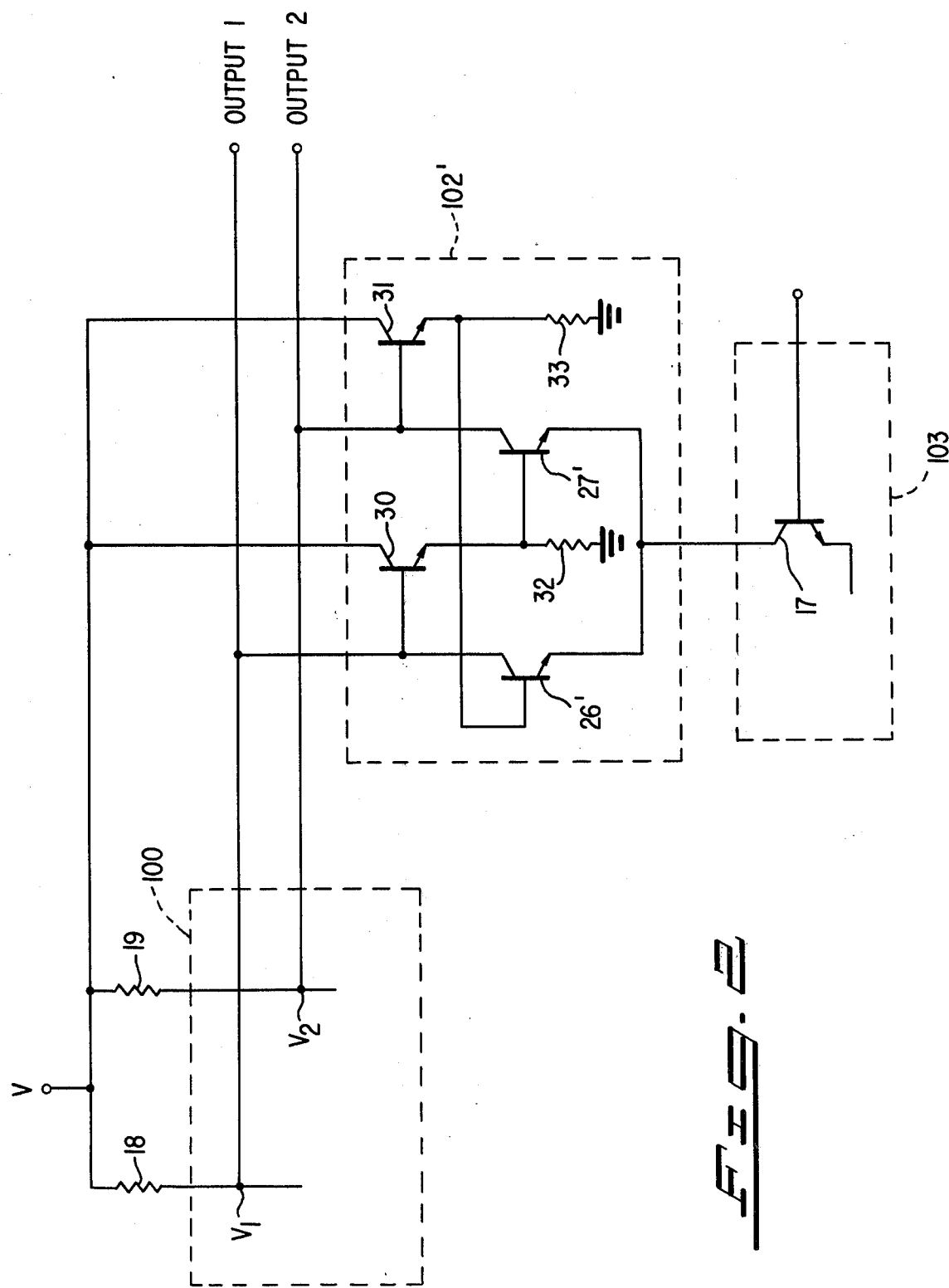
FIG. 2 is a circuit diagram of a second embodiment of the latch portion of the comparator.

The operation of the embodiment of the comparator of FIG. 1 in the "latch" mode as described above, results in the base of the conducting latch transistor (26 or 27) being at a higher potential than its collector. While this condition does not affect the slow speed operation of the latch, existence of such a forward bias on the collector diode of a transistor in the "on" condition slows the speed with which the transistor can be turned "off" since the excess current carrier charge in the vicinity of the collector diode must be removed before the transistor will turn "off." An alternate embodiment of the output latch portion of the invented comparator is shown in FIG. 2 which avoids this problem by adding two additional transistors which serve to maintain the base of the "on" latch transistor at a lower potential. Portions of the Gilbert Gain Cell 100 and the switching means 103 of the embodiment of FIG. 1 are reproduced in FIG. 2 showing how the alternate latch 102' is connected to the other components of the circuit.

The output latch 102' of FIG. 2 includes two latching transistors 26' and 27' which correspond to transistors 26 and 27 of FIG. 1. However, instead of the collector of transistor 26' being directly coupled to the base of transistor 27' and the collector of transistor 27' being coupled to the base of transistor 26' as in latch 102 of FIG. 1, the coupling is accomplished through emitter followers comprised of transistors 30 and 31 and resistors 32 and 33. Since the base-emitter voltage of transistors 30 and 31 is of the order of 0.5 volts, the base of the "on" transistor in the "latch" mode (26' or 27') will be 0.5 volts lower in potential, as compared with the corresponding transistor in the latch 102 of FIG. 1. This 0.5 volt reduction in potential is enough to prevent the collector diode of the "on" latch transistor from being forward biased, and thus slow down the operation of the comparator.

Thus, by combining the high sensitivity and fast response of a Gilbert Gain Cell with a clocked latch as described above, an extremely sensitive high speed comparator which generates logic signals for use in low level differential logic circuits can be obtained. Various modifications of the circuits described herein will be apparent to those skilled in the art and such are considered to be within the spirit of this invention as set forth in the appended claims.

I claim:

1. A voltage comparator having first and second states which comprises:
   means responsive to a control signal for selecting the state of said comparator;
   first means, responsive to an input voltage difference, for providing first and second currents when the first of said comparator states has been selected;
   a differential current amplifier operable when the first of said comparator states has been selected, for amplifying the difference between said first and second currents;
   second means responsive to said differential current amplifier for producing a differential voltage which is a function of the amplified difference between said first and second currents; and
   latching means coupled to said second means for increasing and latching said differential voltage when the second of said comparator states has been selected.

2. The voltage comparator as recited in claim 1 and further including fifth means for coupling a third current to said differential amplifier, and wherein said differential current amplifier comprises:
   third and fourth means for coupling said first and second currents respectively from said first means to said second means;
   sixth means responsive to the difference between said first and second currents for dividing said third current into first and second portions; and
   means for adding said first portion to said first current and said second portion to said second current whereby the difference in currents coupled to said second means will be greater than the difference between said first and second currents.

3. A voltage comparator as recited in claim 2 and further including current regulating means whereby said third current and the sum of said first and second currents are each substantially constant when said comparator is in the first of said states.

4. A voltage comparator as recited in claims 2 or 3 where said third and fourth means are first and second transistors respectively each having its emitter coupled to said first means and its collector coupled to said second means, and where said sixth means comprises third and fourth transistors, each having its emitter coupled to said fifth means, the bases of said third and fourth transistors being coupled to the emitters of said first and second transistors, respectively and the collectors of said third and fourth transistors being coupled to the collectors of said second and first transistors, respectively.

5. A voltage comparator as recited in claim 4 wherein said latching means comprises fifth and sixth transistors, the base of said fifth transistor being coupled to the collector of said sixth transistor and the base of said sixth transistor being coupled to the collector of said fifth transistor, the emitters of said fifth and sixth transistors being coupled together.

6. A voltage comparator which comprises:
a current amplifier having a pair of current input terminals, a pair of current output terminals, and a common terminal;
an input amplifier having a pair of input terminals, a pair of output terminals, and a common terminals said output terminals being coupled to said current input terminals of said current amplifier;
a pair of load devices each coupled between a current output terminal of said current amplifier and a first power terminal;
a first switching means coupled between a second power terminal and said common terminal of said current amplifier;
a second switching means coupled between said second power terminal and said common terminal of said input amplifier;
latching means coupled between said pair of load devices;
a third switching means coupled between said latching means and said second power terminal; and
means for coupling a source of voltage to said power terminals,
said input amplifier and said current amplifier being operative to produce a differential voltage between said load devices responsive to a differential voltage at said input terminals of said input amplifier when said first and second switching means are on, and said latching means being operative to increase and latch said differential voltage between said load devices when said third switching means is on.

7. A voltage comparator as recited in claim 6 wherein said current amplifier comprises:
a first transistor having its emitter and collector coupled to the first of said current input and current output terminals respectively;
a second transistor having its emitter and collector coupled to the second of said current input and current output terminals respectively;
a third transistor having its base coupled to said first current input terminal, its collector coupled to said second current input terminal, and its emitter coupled to said common terminal of said current amplifier; and a fourth transistor having its base coupled to said second current input terminal, its collector coupled to said first current input terminal, and its emitter coupled to said common terminal of said current amplifier.

8. A voltage comparator as recited in claims 6 or 7 and further including current regulating means for regulating the current through said current amplifier.

9. A voltage comparator as recited in claims 6 or 7 wherein said first, second and third switching means are comprised of transistors, said transistors not being saturated when the respective switching means are conducting current.

10. A comparator comprising:
means for supplying a clock signal having a first state and a second state;
means for providing current to said comparator;
first means responsive to said clock signal and operative to selectively conduct and divide said current when said clock signal is in said first state so as to provide a first portion of said current and a second portion of said current;
second means responsive to said clock signal and operative to conduct said current when said clock signal is in said second state;
third means responsive to a first input voltage and a second input voltage and operative to divide said second portion of current into third and fourth currents when said clock signal is in said first state;
fourth means responsive to said third and fourth currents and said first portion of current and operative to amplify said third and fourth currents;
fifth means responsive to said amplified third and fourth currents and operative to provide third and fourth voltages having a voltage differential corresponding to the difference in said first and second input voltages; and
sixth means having two stable conductive states responsive to the polarity of said voltage differential and operative to increase said voltage differential when said clock signal is in said second state.

11. A comparator as recited in claim 10 wherein said fourth means comprises:
seventh and eighth means for coupling said third and fourth currents respectively to said fifth means;
ninth means responsive to the difference between said third and fourth currents for dividing said first portion of current into fifth and sixth currents; and
means for coupling said fifth and sixth currents to said fifth means whereby said third and fifth currents will be additive and said fourth and sixth currents will be additive whereby the difference between the sum of said third and fifth currents and the sum of said fourth and sixth currents will be greater than the difference between said third and fourth currents.

12. A comparator as recited in claim 11 wherein said seventh and eighth means comprise first and second transistors, the emitters of said first and second transistors being coupled to said third means and the collectors of said first and second transistors being coupled to said fifth means whereby said third and fourth currents will flow through said first and second transistors, respectively.

13. A comparator as recited in claim 11 wherein said ninth means comprises third and fourth transistors, the bases of said third and fourth transistors being coupled to the emitters of said first and second transistors respectively and the collectors of said third and fourth transistors being coupled to the collectors of said second and first transistors respectively.

14. A comparator as recited in claims 10, 11 or 12 wherein said first means is comprised of third and fourth transistors for conducting said first and second portions of current respectively, and said second means is comprised of a fifth transistor, none of said third, fourth or fifth transistors being saturated when said respective transistor is conducting current.

15. A comparator as recited in claims 11, 12 or 13 and further including current regulating means whereby said first and second portions of current are maintained at a substantially constant value when said clock signal is in said first state.

16. A comparator for use with a clock signal having a first state and a second state and with a source of current comprising;
- first means responsive to said clock signal and operative to selectively conduct and divide said current when said clock signal is in said first state so as to provide a first portion of said current and a second portion of said current;
- second means responsive to said clock signal and operative to conduct said current when said clock signal is in said second state;
- third means responsive to a first input voltage and a second input voltage and operative to divide said second portion of current into third and fourth currents when said clock signal is in said first state;
- fourth means responsive to said third and fourth currents and said first portion of current and operative to amplify said third and fourth currents;
- fifth means responsive to said amplified third and fourth currents and operative to provide third and fourth voltages having a voltage differential corresponding to the difference in said first and second input voltages; and
- sixth means having two stable conductive states responsive to the polarity of said voltage differential and operative to increase said voltage differential when said clock signal is in said second state.

17. A comparator as recited in claim 16 wherein said fourth means comprises:
- seventh and eighth means for coupling said third and fourth currents respectively to said fifth means;
- ninth means responsive to the difference between said third and fourth currents for dividing said first portion of current into fifth and sixth currents; and
- means for coupling said fifth and sixth currents to said fifth means whereby said third and fifth currents will be additive and said fourth and sixth currents will be additive whereby the difference between the sum of said third and fifth currents and the sum of said fourth and sixth currents will be greater than the difference between said third and fourth currents.

18. A comparator as recited in claim 16 wherein said seventh and eighth means comprise first and second transistors, the emitters of said first and second transistors being coupled to said third means and the collectors of said first and second transistors being coupled to said fifth means whereby said third and fourth currents will flow through said first and second transistors, respectively.

19. A comparator as recited in claim 18 wherein said ninth means comprises third and fourth transistors, the bases of said third and fourth transistors being coupled to the emitters of said first and second transistors respectively and the collectors of said third and fourth transistors being coupled to the collectors of said second and first transistors respectively.

20. A comparator as recited in claims 16, 17, 18 or 19 and further including current regulating means whereby said first and second portions of current are maintained at a substantially constant value when said clock signal is in said first state.

21. A comparator as recited in claims 16, 17, 18 or 19 wherein said sixth means comprises third and fourth transistors, the base of said third transistor being coupled to the collector of said fourth transistor and the base of said fourth transistor being coupled to the collector of said third transistor, the collectors of said third and fourth transistors being coupled to said fifth means and the emitters of said third and fourth transistors being coupled to said second means.

22. A comparator as recited in claim 21 and further including means for providing a voltage difference between the collector of said third transistor and the base of said fourth transistor, and also between the collector of said fourth transistor and the base of said third transistor whereby the collector diodes of said third and fourth transistors will not be forward biased.

23. A comparator as recited in claim 22 wherein said means for providing said voltage difference comprises fifth and sixth transistors, said voltage differences being the voltage drops across the base emitter diodes of said fifth and sixth transistors.

* * * * *